United States Patent
Yu (10) Patent No.: US 6,383,904 B1
(45) Date of Patent: May 7, 2002

(54) FABRICATION OF SELF-ALIGNED FRONT GATE AND BACK GATE OF A FIELD EFFECT TRANSISTOR IN SEMICONDUCTOR ON INSULATOR

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 72 days.

(21) Appl. No.: 09/690,081

(22) Filed: Oct. 16, 2000

(51) Int. Cl.$^7$ .................. H01L 21/3205; H01L 21/4763
(52) U.S. Cl. ...................... 438/589; 257/347; 257/366
(58) Field of Search ................................ 438/282–286, 438/288, 584–590, 517, 520, 524–529, 588, 589, 587; 257/347, 354, 365, 366

(56) References Cited

U.S. PATENT DOCUMENTS

| | | | |
|---|---|---|---|
| 5,273,921 A | * 12/1993 | Neudeck et al. | 437/41 |
| 6,329,256 B1 | * 12/2001 | Ibok | 438/299 |
| 6,342,717 B1 | * 1/2002 | Komatsu | 257/347 |
| 6,346,446 B1 | * 2/2002 | Ritenour | 438/283 |

* cited by examiner

Primary Examiner—Matthew Smith
Assistant Examiner—Calvin Lee
(74) Attorney, Agent, or Firm—Monica H. Choi

(57) ABSTRACT

For fabricating a field effect transistor on a semiconductor substrate in SOI (semiconductor on insulator) technology, a first layer of dielectric material is formed on the semiconductor substrate, and a layer of amorphous semiconductor material is deposited on the first layer of dielectric material. A second layer of dielectric material is deposited on the layer of amorphous semiconductor material, and a front gate opening is etched through the second layer of dielectric material to expose the layer of amorphous semiconductor material through the front gate opening. An amorphization dopant is implanted into the semiconductor substrate through the front gate opening to form a back gate region of amorphous semiconductor material in the semiconductor substrate such that the back gate region is formed to be aligned under the front gate opening. In addition, a back gate dopant is implanted into the back gate region of amorphous semiconductor material through the front gate opening. A gate dielectric is formed at the bottom of the front gate opening to contact the layer of amorphous semiconductor material, and a remaining portion of the front gate opening is filled with a gate electrode material. In this manner, because the same front gate opening is used for forming both the front gate electrode and the back gate region, the front gate electrode and the back gate region are substantially aligned with each other to ensure that the back gate region overlaps the front gate electrode. Thus, the area of the back gate region is minimized to be substantially aligned to the area of the channel region under the gate dielectric. A minimized area of the back gate region in turn minimizes the parasitic capacitance from the back gate region to enhance the speed performance of the MOSFET.

18 Claims, 6 Drawing Sheets

FABRICATION OF SELF-ALIGNED FRONT GATE AND BACK GATE OF A FIELD EFFECT TRANSISTOR IN SEMICONDUCTOR ON INSULATOR

TECHNICAL FIELD

The present invention relates generally to fabrication of field effect transistors having scaled-down dimensions, and more particularly, to fabrication of a field effect transistor in SOI (semiconductor on insulator) technology with a front gate and a back gate that are self-aligned for minimizing short-channel effects in the field effect transistor.

BACKGROUND OF THE INVENTION

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

Figure 1:
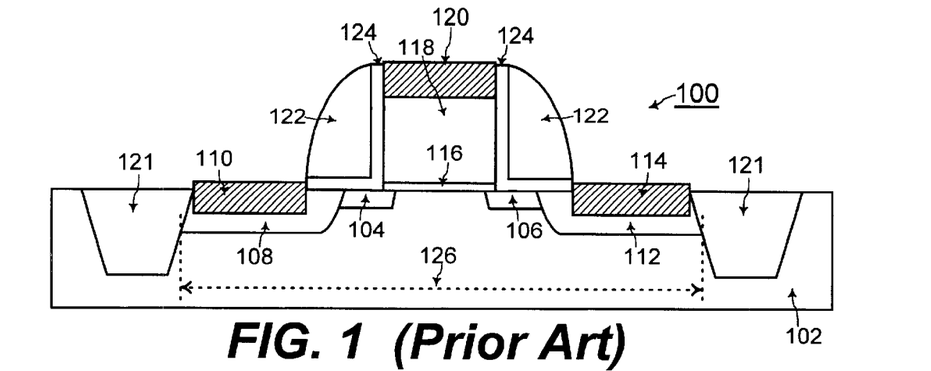
FIG. 1 shows a cross-sectional view of a conventional MOSFET (Metal Oxide Semiconductor Field Effect Transistor) fabricated within a semiconductor substrate.

Referring to FIG. 1, a common component of a monolithic IC is a MOSFET (Metal Oxide Semiconductor Field Effect Transistor) 100 which is fabricated within a semiconductor substrate 102. The scaled down MOSFET 100 having submicron or nanometer dimensions includes a drain extension junction 104 and a source extension junction 106 formed within an active device area 126 of the semiconductor substrate 102. The drain extension junction 104 and the source extension junction 106 are shallow junctions to minimize short-channel effects in the MOSFET 100 having submicron or nanometer dimensions, as known to one of ordinary skill in the art of integrated circuit fabrication.

The MOSFET 100 further includes a drain contact junction 108 with a drain silicide 110 for providing contact to the drain of the MOSFET 100 and includes a source contact junction 112 with a source silicide 114 for providing contact to the source of the MOSFET 100. The drain contact junction 108 and the source contact junction 112 are fabricated as deeper junctions such that a relatively large size of the drain silicide 110 and the source silicide 114 respectively may be fabricated therein to provide low resistance contact to the drain and the source respectively of the MOSFET 100.

The MOSFET 100 further includes a gate dielectric 116 and a gate structure 118 which may be comprised of polysilicon. A gate silicide 120 is formed on the polysilicon gate structure 118 for providing contact to the gate of the MOSFET 100. The MOSFET 100 is electrically isolated from other integrated circuit devices within the semiconductor substrate 102 by shallow trench isolation structures 121. The shallow trench isolation structures 121 define the active device area 126, within the semiconductor substrate 102, where a MOSFET is fabricated therein.

The MOSFET 100 also includes a spacer 122 disposed on the sidewalls of the gate structure 118 and the gate dielectric 116. When the spacer 122 is comprised of silicon nitride ($Si_3N_4$), then a spacer liner oxide 124 is deposited as a buffer layer between the spacer 122 and the sidewalls of the gate structure 118 and the gate dielectric 116.

As the dimensions of the MOSFET 100 are scaled down further, the junction capacitances formed by the drain and source extension junctions 104 and 106 and by the drain and source contact junctions 108 and 112 may limit the speed performance of the MOSFET 100. Thus, referring to FIG. 2, a MOSFET 150 is formed with SOI (semiconductor on insulator) technology. In that case, a layer of dielectric material 152 is formed on the semiconductor substrate 102, and a layer of semiconductor material 154 is formed on the layer of dielectric material 152. A drain 156 and a source 158 of the MOSFET 150 are formed in the layer of semiconductor material 154. Elements such as the gate dielectric 116 and the gate structure 118 having the same reference number in FIGS. 1 and 2 refer to elements having similar structure and function. Processes for formation of such elements 116, 118, 152, 154, 156, and 158 of the MOSFET 150 are known to one of ordinary skill in the art of integrated circuit fabrication.

Figure 2:
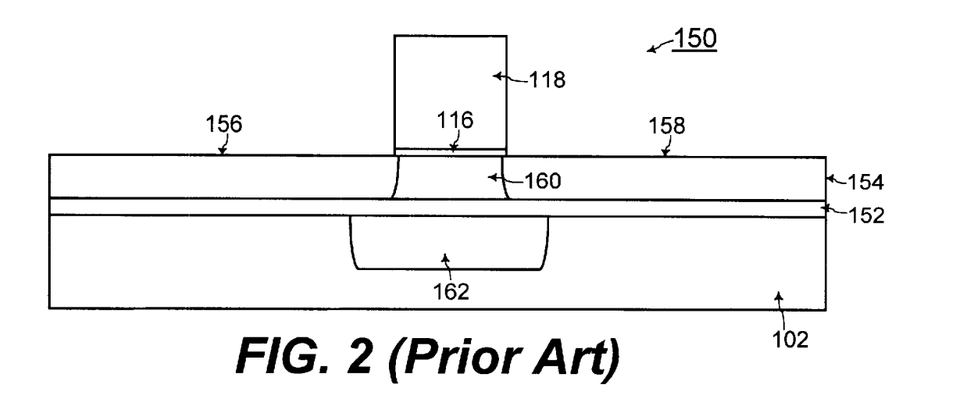
FIG. 2 shows a cross-sectional view of a MOSFET (Metal Oxide Semiconductor Field Effect Transistor) fabricated with SOI (semiconductor on insulator) technology for minimizing junction capacitance but with a relatively large area of a back gate region, according to the prior art.

In FIG. 2, the drain 156 and the source 158 are formed to extend down to contact the layer of dielectric material 152. Thus, because the drain 156, the source 158, and a channel region 160 of the MOSFET 150 do not form a junction with the semiconductor substrate 102, junction capacitance is minimized for the MOSFET 150 to enhance the speed performance of the MOSFET 150 formed with SOI (semiconductor on insulator) technology.

In addition, referring to FIGS. 1 and 2, as the dimensions of the MOSFETs 100 and 150 are scaled down further, the occurrence of undesired short-channel effects increases, as known to one of ordinary skill in the art of integrated circuit fabrication. With short-channel effects, the threshold voltage of the MOSFET changes such that electrical characteristics of such a MOSFET become uncontrollable. For the MOSFET 150 formed with SOI (semiconductor on insulator) technology, a back gate region 162 is formed in the semiconductor substrate 102 below the layer of dielectric material 152 to minimize such undesired short-channel effects in the MOSFET 150. The back gate region 162 is doped for enhanced conductivity of the back gate region 162 and for affecting the voltage potential through the channel region 160, as known to one of ordinary skill in the art of integrated circuit fabrication. In addition, a voltage bias may be applied on the back gate region 162 for further controlling the electrical characteristics of the MOSFET 150 to compensate for the short-channel effects in the MOSFET 150.

In the prior art MOSFET 150, the back gate region 162 is first formed within the semiconductor substrate 102 before formation of any of the other elements 116, 118, 152, 154, 156, 158, and 160 of the MOSFET 150. The back gate region 162 is first formed by implantation of a dopant into the back gate region 162 within the semiconductor substrate 102. Then, the layer of dielectric material 152 and the layer of semiconductor material 154 are deposited on the layer of semiconductor material 154. The gate dielectric 116 and the gate structure 118 are then formed on the semiconductor substrate 102. Then, the drain 156 and the source 158 are formed with implantation of a dopant into the layer of semiconductor material 154. Such process steps are known to one of ordinary skill in the art of integrated circuit fabrication.

In this process of the prior art, because the channel region 160 between the drain 156 and the source 158 is formed after formation of the back gate region 162, to ensure that the back gate region 162 is aligned to be under the channel region 160 of the MOSFET 150, the area of the back gate region 162 is formed to be larger than the area of the channel region 160. The larger area of the back gate region 162 accounts for variations in alignment of the channel region 160 to the back gate region 162 when the area of the channel region 160 is defined after formation of the back gate region 162.

However, a larger area of the back gate region 162 results in larger capacitance at the back gate region 162 of the MOSFET 150 which may limit the speed performance of the MOSFET 150. The back gate region 162 forms a junction with the substrate 102 with junction capacitance at such a junction. In addition, the back gate junction 162 overlaps to be disposed under the drain 156 and the source 158 to form overlap capacitance between the back gate region 162 and the drain 156 and the source 158. Such capacitances degrade the speed performance of the MOSFET 150, and such capacitances increase with a larger area of the back gate region 102.

Nevertheless, fabrication of the MOSFET in SOI (semiconductor on insulator) technology is desired because the junction capacitance at the drain and source of the MOSFET is minimized. Thus, a mechanism is desired for minimizing the area of the back gate region while ensuring that the channel region is aligned with the back gate region to minimize parasitic capacitance and undesired short-channel effects of the MOSFET.

SUMMARY OF THE INVENTION

Accordingly, in a general aspect of the present invention, an opening through a layer of dielectric material is used for defining both the area of the back gate region and the area of the channel region to ensure that the back gate region is aligned to the channel region for a field effect transistor formed with SOI (semiconductor on insulator) technology.

In one embodiment of the present invention, in a method for fabricating a field effect transistor on a semiconductor substrate in SOI (semiconductor on insulator) technology, a first layer of dielectric material is formed on the semiconductor substrate, and a seeding window is etched through the first layer of dielectric material to expose the semiconductor substrate through the seeding window. A layer of amorphous semiconductor material is deposited on the first layer of dielectric material, and the amorphous semiconductor material fills the seeding window to contact the semiconductor substrate through the seeding window. A second layer of dielectric material is deposited on the layer of amorphous semiconductor material, and a front gate opening is etched through the second layer of dielectric material to expose the layer of amorphous semiconductor material through the front gate opening. The front gate opening is disposed substantially away from the seeding window such that the front gate opening does not overlap the seeding window.

An amorphization dopant is implanted into the semiconductor substrate through the front gate opening to form a back gate region of amorphous semiconductor material in the semiconductor substrate such that the area of the back gate region is aligned with the front gate opening under the front gate opening. In addition, a back gate dopant is implanted into the back gate region of amorphous semiconductor material through the front gate opening. A gate dielectric is formed at a bottom of the front gate opening to contact the layer of amorphous semiconductor material, and a remaining portion of the front gate opening is filled with a gate electrode material.

In this manner, because the area of the channel region and the area of the back gate region are defined by the same front gate opening, the channel region is ensured to be aligned to the back gate region. Thus, the area of the back gate region is minimized to be self-aligned to the area of the channel region under the gate dielectric such that parasitic capacitance from the back gate region is minimized to enhance the speed performance of the MOSFET.

In another embodiment of the present invention, spacers are formed on sidewalls of the front gate opening to decrease a length of the front gate opening. For example, the length of the front gate opening before formation of the spacers is in a range of from about 250 nanometers to about 500 nanometers, and the spacers decrease the length of the front gate opening by from about 30 nanometers to about 100 nanometers.

In a further embodiment of the present invention, the second layer of dielectric material is etched away from the layer of amorphous semiconductor material. A drain and source dopant is implanted into exposed regions of the layer of amorphous semiconductor material to form a drain region and a source region that extend down within the layer of amorphous semiconductor material to contact the first layer of dielectric material. A thermal anneal is performed at a temperature less than about 650° Celsius to activate the back gate dopant within the back gate region and to activate the drain and source dopant within the drain region and the source region. The layer of amorphous semiconductor material is recrystallized from the semiconductor substrate through the seeding window during the thermal anneal. By using such a relatively low temperature of less than about 650° Celsius and by using a single anneal for activation of the back gate dopant and the drain and source dopant, the back gate dopant substantially remains within the back gate region during the thermal anneal.

These and other features and advantages of the present invention will be better understood by considering the following detailed description of the invention which is presented with the attached drawings.

The figures referred to herein are drawn for clarity of illustration and are not necessarily drawn to scale. Elements having the same reference number in FIGS. 1, 2, 3, 4, 5, 6, 7, 8, 9, 10, 11, 12, 13, 14, 15, 16, and 17 refer to elements having similar structure and function.

DETAILED DESCRIPTION

Figure 3:
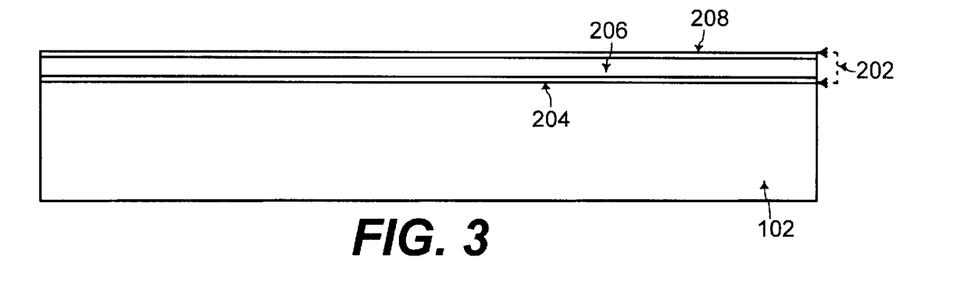
FIGS. 3, 4, 5, 6, 7, 8, 9, 10, 11, 12, 13, 14, 15, and 16 show cross-sectional views for illustrating the steps for using an opening through a layer of dielectric material to define both the area of the back gate region and the area of the channel region to ensure that the back gate region is aligned with the channel region such that the area of the back gate region is minimized for a field effect transistor formed with SOI (semiconductor on insulator) technology, according to an embodiment of the present invention.

In the cross-sectional view of FIG. 3, for fabricating a MOSFET (Metal Oxide Semiconductor Field Effect Transistor) with SOI (semiconductor on insulator) technology, a first layer of dielectric material 202 is deposited on the semiconductor substrate 102. In one embodiment of the present invention, the first layer of dielectric material 202 is comprised of a first layer of silicon dioxide ($SiO_2$) 204 deposited on the semiconductor substrate 102, a layer of low dielectric constant material 206 deposited on the first layer of silicon dioxide (SiO$_2$) 204, and a second layer of silicon dioxide (SiO$_2$) 208 deposited on the layer of low dielectric constant material 206.

Figure 4:
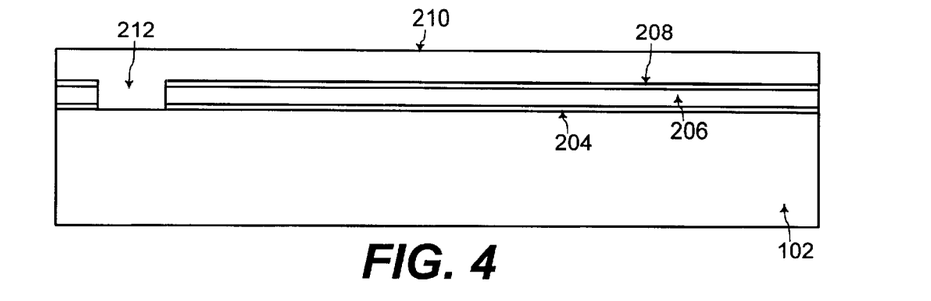

The layer of low dielectric constant material 206 is comprised of a dielectric material such as silicon nitride (Si$_3$N$_4$) or a metal oxide having a dielectric constant that is lower than the dielectric constant of silicon dioxide (SiO$_2$) such that the thickness of the first layer of dielectric material 202 may be larger than if silicon dioxide (SiO$_2$) alone were deposited for the first layer of dielectric material 202. The first and second layers of silicon dioxide (SiO$_2$) 204 and 208 are buffer layers that provide a smooth interface between the layer of low dielectric constant material 206 and the semiconductor substrate 102 and between the layer of low dielectric constant material 206 and a layer of amorphous semiconductor material 210 deposited on the second layer of silicon dioxide (SiO$_2$) 208 as illustrated in FIG. 4. Processes for deposition of the first and second layers of silicon dioxide (SiO$_2$) 204 and 208 and the layer of low dielectric constant material 206 are known to one of ordinary skill in the art of integrated circuit fabrication.

Referring to FIG. 4, after deposition of the first and second layers of silicon dioxide (SiO$_2$) 204 and 208 and the layer of low dielectric constant material 206, a seeding window 212 is etched through the first and second layers of silicon dioxide (SiO$_2$) 204 and 208 and the layer of low dielectric constant material 206 to expose the semiconductor substrate 102 through the seeding window 212. Patterning and etching processes for formation of the seeding window 212 through the first and second layers of silicon dioxide (SiO$_2$) 204 and 208 and the layer of low dielectric constant material 206 are known to one of ordinary skill in the art of integrated circuit fabrication.

Further referring to FIG. 4, after formation of the seeding window 212, the layer of amorphous semiconductor material 210 is deposited on the second layer of silicon dioxide (SiO$_2$) 208 and through the seeding window 212 to contact the semiconductor substrate 102 at the bottom of the seeding window 212. When the semiconductor substrate 102 is comprised of silicon, the layer of amorphous semiconductor material 210 is comprised of amorphous silicon in one embodiment of the present invention. In that case, the thickness of the layer of amorphous silicon 210 is in a range of from about 100 Å (angstroms) to about 500 Å (angstroms). Such a relatively thin layer of amorphous silicon 210 to be used for formation of the drain and source of the MOSFET minimizes short-channel effects in the MOSFET, as known to one of ordinary skill in the art of integrated circuit fabrication. Processes for deposition of such a layer of amorphous semiconductor material 210 are known to one of ordinary skill in the art of integrated circuit fabrication.

Figure 5:
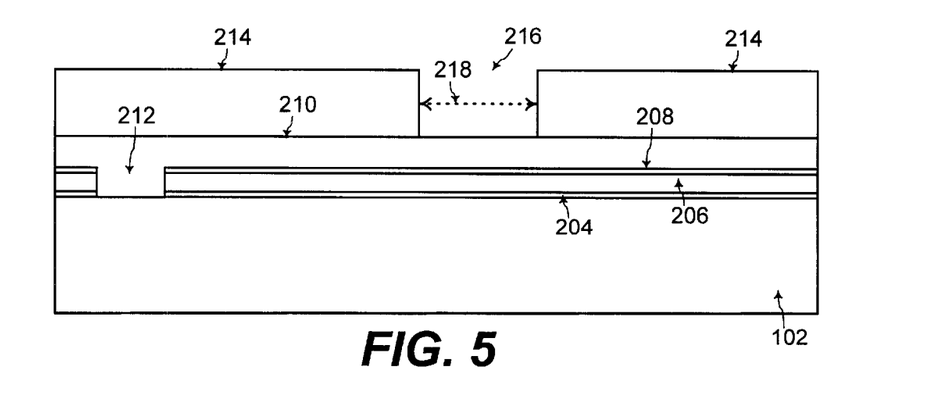

Referring to FIG. 5, a second layer of dielectric material 214 is formed on the layer of amorphous semiconductor material 210. In one embodiment of the present invention, the second layer of dielectric material 214 is comprised of silicon dioxide (SiO$_2$) formed at a relatively low temperature that is less than about 400° Celsius such that the layer of amorphous semiconductor material 210 does not recrystallize during formation of the second layer of dielectric material 214. In that case, the second layer of dielectric material 214 has a thickness in a range of from about 800 Å (angstroms) to about 2000 Å (angstroms). Processes for deposition of such a second layer of dielectric material 214 are known to one of ordinary skill in the art of integrated circuit fabrication.

Further referring to FIG. 5, a front gate opening 216 is etched through the second layer of dielectric material 214 to expose the layer of amorphous semiconductor material 210 through the front gate opening 216. The front gate opening 216 initially has a length 218 when etched through the second layer of dielectric material 214. The front gate opening 216 is disposed substantially away from the seeding window 212 such that the front gate opening 216 and the seeding window 212 do not overlap, as illustrated in FIG. 5. Patterning and etching processes for forming the front gate opening 216 are known to one of ordinary skill in the art of integrated circuit fabrication.

Figure 6:
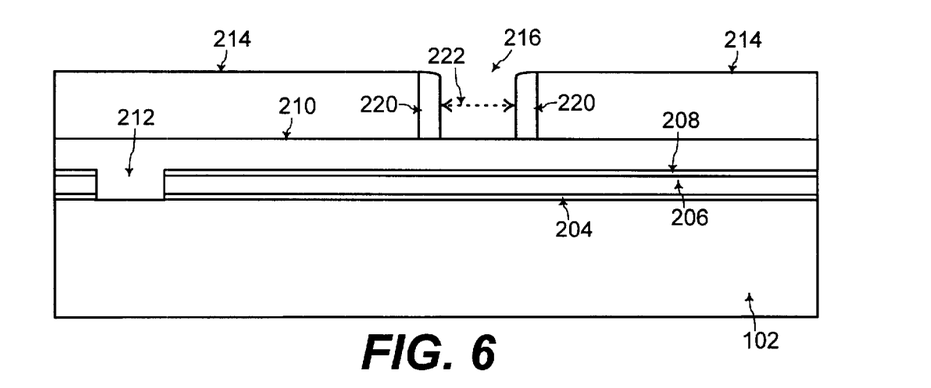

Referring to FIG. 6, spacers 220 are formed at the sidewalls of the front gate opening 216 to reduce the length 218 of the front gate opening 216. For example, in FIG. 5, the initial length 218 of the front gate opening 216 is in a range of from about 250 nanometers to about 500 nanometers, and formation of the spacers 220 in FIG. 6 results in a smaller length 222 that is decreased from the initial length 218 by from about 30 nanometers to about 100 nanometers. In one embodiment of the present invention, when the second layer of dielectric material 214 is comprised of silicon dioxide (SiO$_2$), the spacers 220 are comprised of silicon nitride (Si$_3$N$_4$). Processes for formation of such spacers 220 are known to one of ordinary skill in the art of integrated circuit fabrication.

Figure 7:
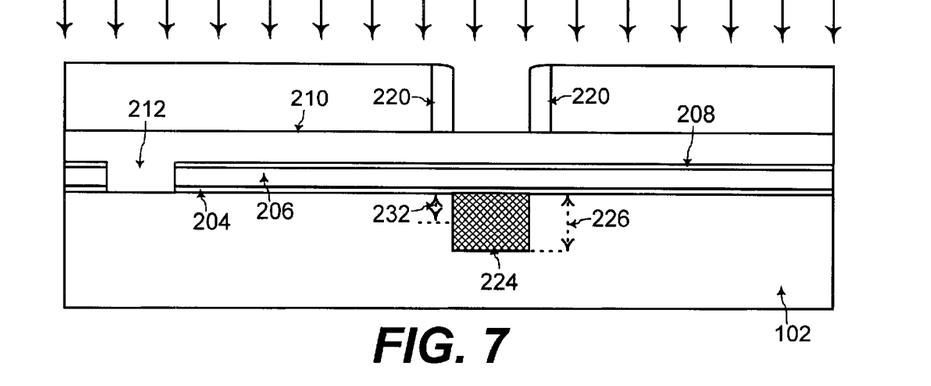

Referring to FIG. 7, an amorphization dopant, such as germanium (Ge) or xenon (Xe) for example, is implanted through the front gate opening 216 into the semiconductor substrate 102 to form a back gate region 224 of amorphous semiconductor material in the semiconductor substrate 102 under the front gate opening 216. For example, when the semiconductor substrate 102 is comprised of silicon, the back gate region 224 is comprised of amorphous silicon from implantation of the amorphization dopant. The second layer of dielectric material 214 and the spacers 220 block the amorphization dopant from being implanted into the rest of the semiconductor substrate 102. Thus, the area of the back gate region 224 is aligned with the area of the front gate opening 216. The amorphization dopant is implanted with a projection profile for a predetermined depth 226 of the back gate region 224 in a range of from about 400 Å (angstroms) to about 600 Å (angstroms). Implantation processes for formation of the back gate region 224 of amorphous semiconductor material are known to one of ordinary skill in the art of integrated circuit fabrication.

Further referring to FIG. 7, after implantation of the amorphization dopant, a back gate dopant, such as arsenic (As) for example, is also implanted into the back gate region 224 through the front gate opening 216. The second layer of dielectric material 214 and the spacers 220 block the back gate dopant from being implanted into the rest of the semiconductor substrate 102.

Figure 8:
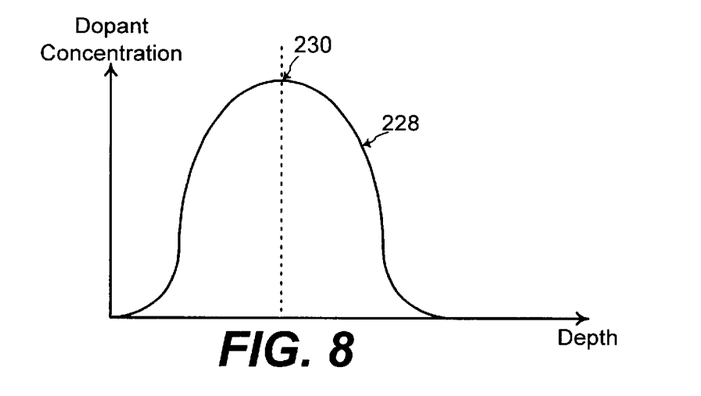

Referring to FIGS. 7 and 8, the concentration of the back gate dopant implanted into the back gate region 224 has a Gaussian dopant distribution profile 228 with a peak 230 of the Gaussian dopant distribution profile 228 being substantially at the middle 232 of the depth 226 of the back gate region 224 and with substantially zero concentration of the back gate dopant at the top and the bottom of the back gate region 224. Such a dopant distribution profile 228 of the back gate dopant within the back gate region 224 ensures that a substantial portion of the back gate dopant remains within the back gate region 224 after any subsequent fabrication process steps that heat up the semiconductor substrate 102. Processes for implanting such a back gate dopant are known to one of ordinary skill in the art of integrated circuit fabrication.

Figure 9:
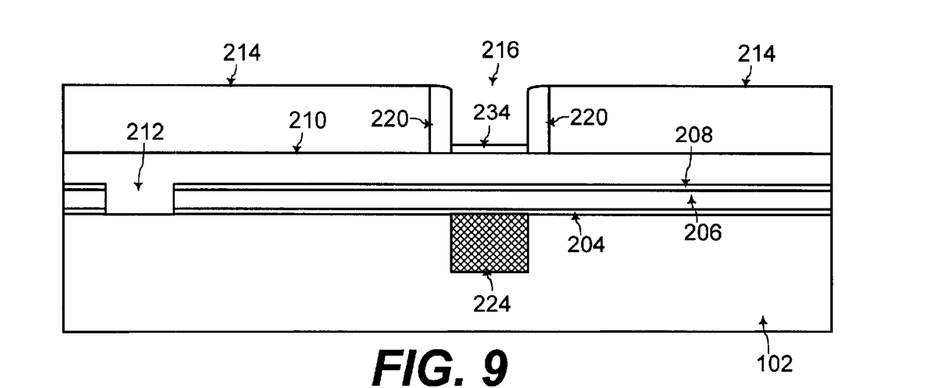

Referring to FIG. 9, a gate dielectric 234 is formed on the exposed surface of the layer of amorphous semiconductor material 210 at the bottom of the front gate opening 216. The gate dielectric 234 is comprised of silicon dioxide ($SiO_2$) in one embodiment of the present invention. In an alternative embodiment of the present invention, the gate dielectric 234 is comprised of a dielectric material, such as a metal oxide for example, that has a dielectric constant that is lower than the dielectric constant of silicon dioxide ($SiO_2$) such that the thickness of the gate dielectric 234 may be larger than if the gate dielectric were comprised of silicon dioxide ($SiO_2$) for a given capacitance of the gate dielectric 234. A thicker gate dielectric 234 is advantageous for minimizing undesired tunneling current through the gate dielectric 234, as known to one of ordinary skill in the art of integrated circuit fabrication. Processes for formation of such a gate dielectric 234 are known to one of ordinary skill in the art of integrated circuit fabrication.

Figure 10:
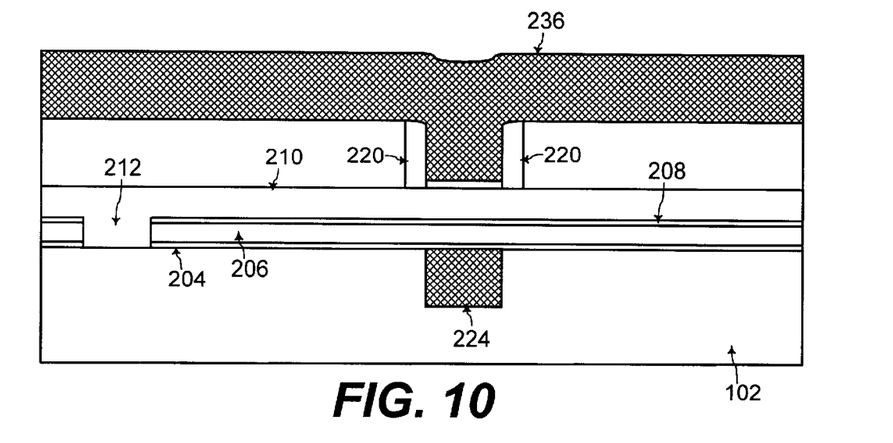

Referring to FIGS. 9 and 10, after formation of the gate dielectric 234 at the bottom of the front gate opening 216, a gate electrode material 236 is conformally deposited to fill the remaining portion of the front gate opening 216. The gate electrode material 236 may be a semiconductor material such as silicon germanium (SiGe) in one embodiment of the present invention. Alternatively, the gate electrode material 236 may be a metal such as silver or tungsten in another embodiment of the present invention. Processes for conformal deposition of such a gate electrode material 236 are known to one of ordinary skill in the art of integrated circuit fabrication.

Figure 11:
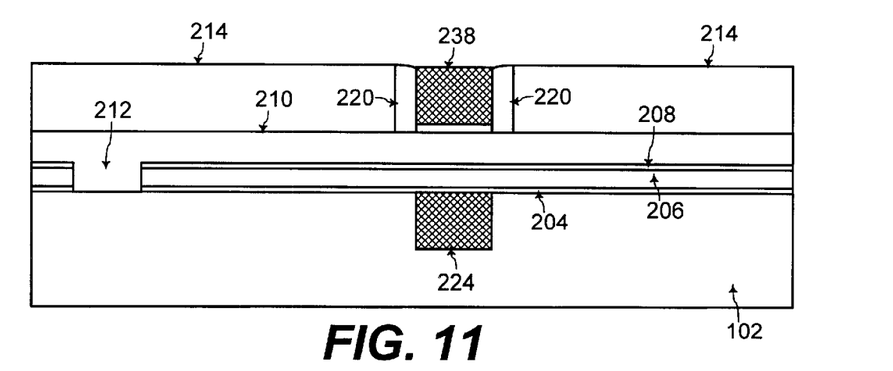

Referring to FIG. 11, the gate electrode material 236 is polished down until the second layer of dielectric material 214 is exposed such that the gate electrode material 236 is contained within the front gate opening 216. The gate electrode material 236 contained with the front gate opening 216 forms a front gate electrode 238 of the MOSFET. Polishing processes such a CMP (chemical mechanical polishing) processes for polishing down the gate electrode material 236 are known to one of ordinary skill in the art of integrated circuit fabrication.

Figure 12:
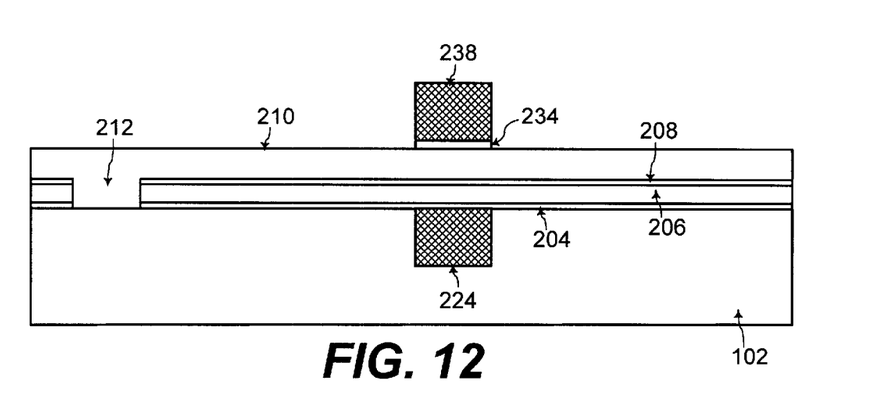

Referring to FIGS. 11 and 12, the second layer of dielectric material 214 and the spacers 220 are etched away from the layer of amorphous semiconductor material 210 to expose the front gate electrode 238 and the gate dielectric 234. Etching processes for etching away the second layer of dielectric material 214 which may be comprised of silicon dioxide ($SiO_2$) and the spacers 220 which may be comprised of silicon nitride ($Si_3N_4$) are known to one of ordinary skill in the art of integrated circuit fabrication.

Figure 13:
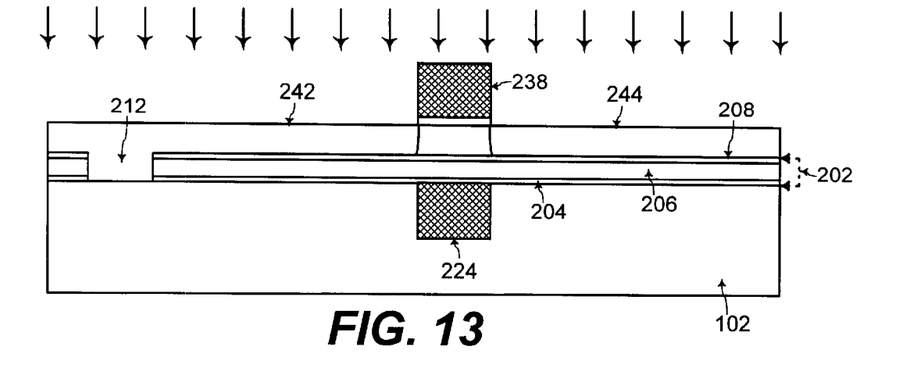

Referring to FIG. 13, a drain and source dopant is implanted into exposed regions of the layer of amorphous semiconductor material 210 to form a drain region 242 and a source region 244 that extend down to contact the first layer of dielectric material 202. The channel region of the MOSFET is the portion of the layer of amorphous semiconductor material 210 disposed under the gate dielectric 234 between the drain region 242 and the source region 244. When the gate electrode material 236 forming the front gate electrode 238 is a semiconductor material such as silicon germanium (SiGe) for example, the drain and source dopant is also implanted into the front gate electrode 238.

The drain and source dopant is an N-type dopant for forming the drain region 242 and the source region 244 of an NMOSFET (N-channel Metal Oxide Semiconductor Field Effect Transistor). Alternatively, the drain and source dopant is a P-type dopant for forming the drain region 242 and the source region 244 of a PMOSFET (P-channel Metal Oxide Semiconductor Field Effect Transistor). Processes for implantation of such a dopant are known to one of ordinary skill in the art of integrated circuit fabrication.

After implantation of the drain and source dopant, a thermal anneal is performed to activate the drain and source dopant in the drain region 242 and the source region 244 (and in the front gate electrode 238 when the gate electrode material 236 forming the front gate electrode 238 is a semiconductor material such as silicon germanium (SiGe) for example). In addition, during this thermal anneal, the back gate dopant within the back gate region 224 is also activated. During this thermal anneal, the layer of amorphous semiconductor material 210 having the drain region 242 and the source region 244 is recrystallized from contact of the semiconductor substrate 102 at the bottom of the seeding window 212. Thermal anneal processes for activating dopants are known to one of ordinary skill in the art of integrated circuit fabrication.

Because the drain and source dopant and the back gate dopant are being activated within amorphous semiconductor material such as amorphous silicon or possibly within the front gate electrode comprised of silicon germanium (SiGe), a relatively low temperature less than about 650° Celsius may be used for the thermal anneal. Such a relatively low temperature minimizes thermal diffusion of dopants such that the back gate dopant substantially remains within the back gate region 224. In addition, according to an aspect of the present invention, a single thermal anneal is performed for activating both the drain and source dopant and the back gate dopant to further minimize thermal diffusion of dopants such that the back gate dopant substantially remains within the back gate region 224.

Figure 14:
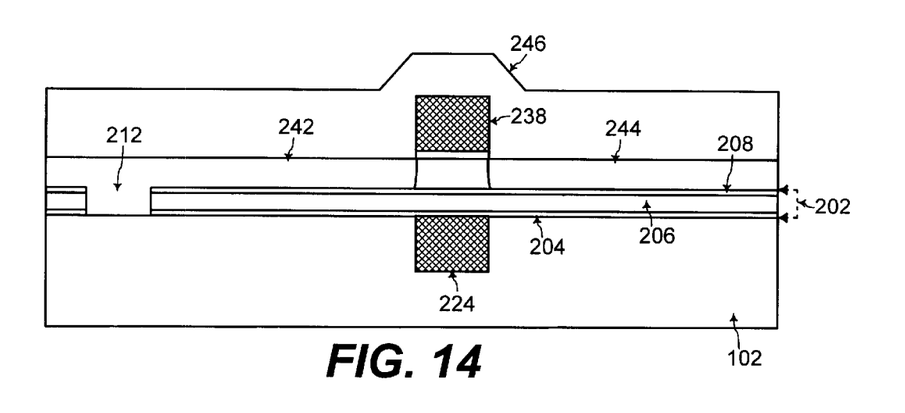

Referring to FIG. 14, a passivation layer 246 of dielectric material such as silicon dioxide ($SiO_2$) is deposited to electrically isolate the components of the MOSFET of the present invention. Processes for deposition of such a passivation layer 246 of dielectric material are known to one of ordinary skill in the art of integrated circuit fabrication.

Figure 15:
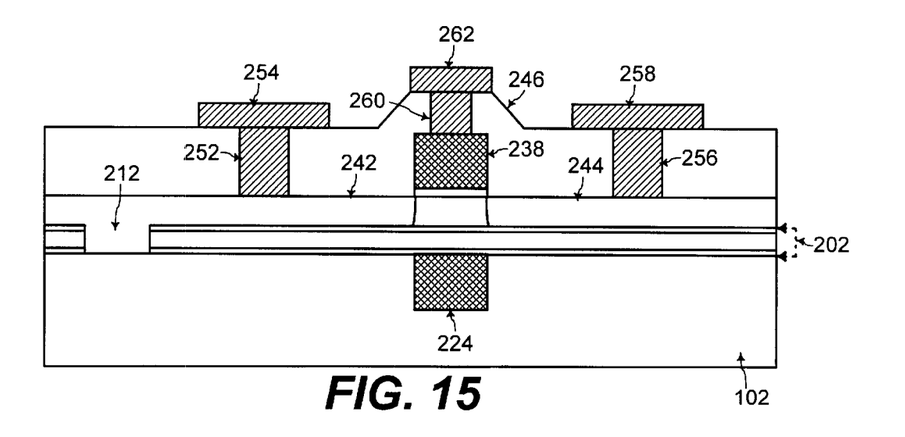

Referring to FIG. 15, a drain via 252 and a drain contact 254 are formed to contact the drain region 242 for providing connection to the drain of the MOSFET, and a source via 256 and a source contact 258 are formed to contact the source region 244 for providing connection to the source of the MOSFET. A front gate via 260 and a front gate contact 262 are formed to contact the front gate electrode 238 for providing connection to the front gate electrode 238 of the MOSFET. Processes for formation of such interconnect structures 252, 254, 256, 258, 260, and 262 are known to one of ordinary skill in the art of integrated circuit fabrication.

Figure 16:
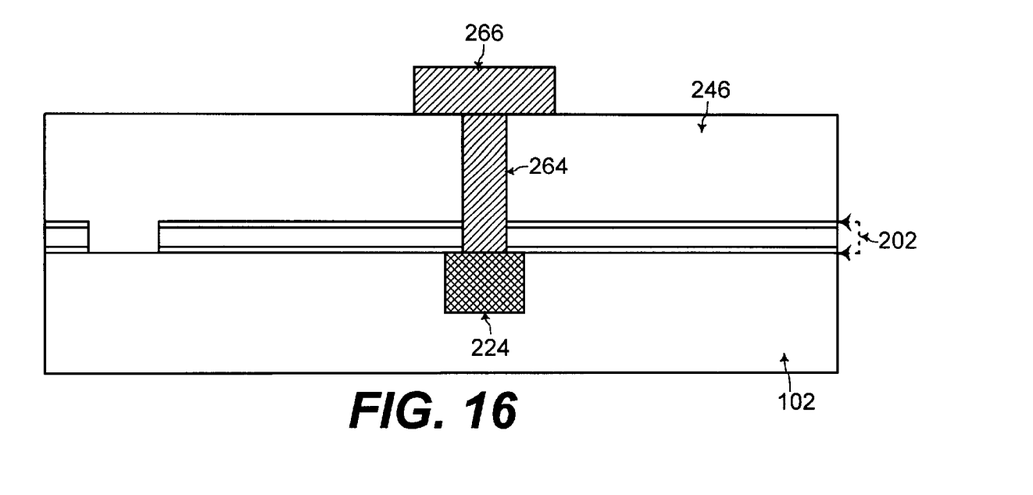
Figure 17:
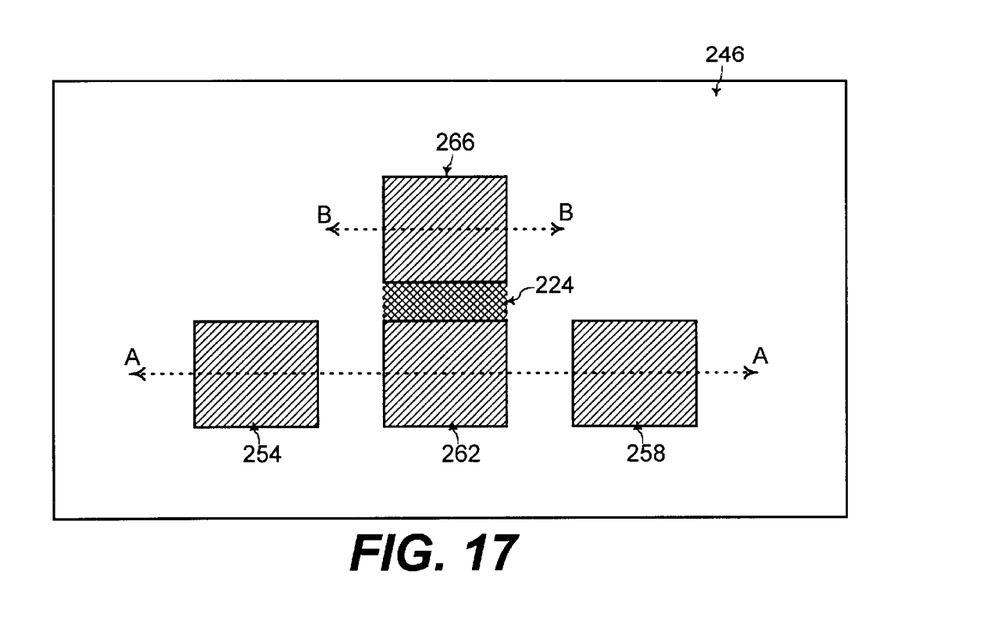
FIG. 17 shows a top view of contacts for the drain, the source, the front gate, and the back gate of the field effect transistor of FIGS. 15 and 16.

In addition, referring to FIG. 16, at a different cross-sectional view, a back gate via 264 and a back gate contact 266 may be formed to contact the back gate region 224 for providing connection to the back gate region 224. FIG. 17 shows a top view of the passivation layer 246 with formation of the drain contact 254, the front gate contact 262, and the source contact 258. The cross-sectional views of FIGS. 3, 4, 5, 6, 7, 9, 10, 11, 12, 13, 14, and 15 are through a line A—A in FIG. 17. Referring to FIGS. 16 and 17, the back gate region 224 may be formed to extend beyond the front gate electrode 238 such that the back gate via 264 and the back gate contact 266 may be formed for providing connection to the back gate region 224. In that case, the cross-sectional view of FIG. 16 is through a line B—B in FIG. 17. The back gate contact 266 may be used to apply a voltage on the back region 224 for further controlling the threshold voltage of the MOSFET to compensate for undesired short-channel effects in the MOSFET.

In this manner, because the same front gate opening 216 is used for forming both the front gate electrode 238 and the back gate region 224, the front gate electrode 238 and the back gate region 224 are substantially aligned with each other to ensure that the back gate region 224 overlaps with the front gate electrode 238. Thus, the area of the back gate region 224 is minimized to be substantially aligned to the channel region under the gate dielectric 234. A minimized area of the back gate region 224 in turn minimizes the parasitic capacitance from the back gate region 224 to enhance the speed performance of the MOSFET formed with SOI (semiconductor on insulator) technology.

The foregoing is by way of example only and is not intended to be limiting. For example, any specified material or any specified dimension of any structure described herein is by way of example only. In addition, as will be understood by those skilled in the art, the structures described herein may be made or used in the same way regardless of their position and orientation. Accordingly, it is to be understood that terms and phrases such as "over," "sidewall," "below," and "on" as used herein refer to relative location and orientation of various portions of the structures with respect to one another, and are not intended to suggest that any particular absolute orientation with respect to external objects is necessary or required.

The present invention is limited only as defined in the following claims and equivalents thereof.

I claim:

1. A method for fabricating a field effect transistor on a semiconductor substrate in SOI (semiconductor on insulator) technology, the method including the steps of:

A. forming a first layer of dielectric material on said semiconductor substrate;

B. etching a seeding window through said first layer of dielectric material to expose said semiconductor substrate through said seeding window;

C. depositing a layer of amorphous semiconductor material on said first layer of dielectric material, wherein said amorphous semiconductor material fills said seeding window to contact said semiconductor substrate through said seeding window;

D. depositing a second layer of dielectric material on said layer of amorphous semiconductor material;

E. etching a front gate opening through said second layer of dielectric material to expose said layer of amorphous semiconductor material through said front gate opening, wherein said front gate opening is disposed substantially away from said seeding window such that said front gate opening does not overlap said seeding window;

F. implanting an amorphization dopant into said semiconductor substrate through said front gate opening to form a back gate region of amorphous semiconductor material in said semiconductor substrate, wherein the area of said back gate region is formed to be aligned with said front gate opening under said front gate opening;

G. implanting a back gate dopant into said back gate region of amorphous semiconductor material through said front gate opening;

H. forming a gate dielectric at a bottom of said front gate opening to contact said layer of amorphous semiconductor material; and I. filling a remaining portion of said front gate opening with a gate electrode material.

2. The method of claim 1, further including the step of:

forming spacers on sidewalls of said front gate opening after said step E and before said step F to decrease a length of said front gate opening.

3. The method of claim 2, wherein said length of said front gate opening before formation of said spacers is in a range of from about 250 nanometers to about 500 nanometers, and wherein said spacers decrease said length of said front gate opening by from about 30 nanometers to about 100 nanometers.

4. The method of claim 2, wherein said second layer of dielectric material is comprised of silicon dioxide ($SiO_2$), and wherein said spacers are comprised of silicon nitride ($Si_3N_4$).

5. The method of claim 1, wherein said second layer of dielectric material is comprised of silicon dioxide ($SiO_2$) formed with a deposition temperature that is less than about 400° Celsius.

6. The method of claim 1, further including the step of:

performing a thermal anneal at a temperature less than about 650° Celsius to activate said back gate dopant within said back gate region.

7. The method of claim 1, further including the steps of:

etching said second layer of dielectric material away from said layer of amorphous semiconductor material;

implanting a drain and source dopant into exposed regions of said layer of amorphous semiconductor material to form a drain region and a source region that extend down within said layer of amorphous semiconductor material to contact said first layer of dielectric material; and performing a thermal anneal at a temperature less than about 650° Celsius to activate said back gate dopant within said back gate region and to activate said drain and source dopant within said drain region and said source region;

wherein said layer of amorphous semiconductor material is recrystallized from said semiconductor substrate through said seeding window during said thermal anneal.

8. The method of claim 7, wherein said gate electrode material is comprised of a semiconductor material, and wherein said drain and source dopant is implanted into said gate electrode material during said step of implanting said drain and source dopant into said layer of amorphous semiconductor material, and wherein said drain and source dopant is activated within said gate electrode material during said thermal anneal.

9. The method of claim 7, wherein said drain and source dopant is an N-type dopant for fabrication of an NMOSFET (N-channel Metal Oxide Semiconductor Field Effect Transistor).

10. The method of claim 7, wherein said drain and source dopant is a P-type dopant for fabrication of an PMOSFET (P-channel Metal Oxide Semiconductor Field Effect Transistor).

11. The method of claim 1, wherein said gate electrode material is comprised of silicon germanium (SiGe).

12. The method of claim 1, wherein said gate electrode material is comprised of metal.

13. The method of claim 1, wherein said first layer of dielectric material is comprised of a first layer of silicon dioxide ($SiO_2$) on said semiconductor substrate, a layer of silicon nitride ($Si_3N_4$) on said first layer of silicon dioxide ($SiO_2$), and a second layer of silicon dioxide ($SiO_2$) on said layer of silicon nitride ($Si_3N_4$).

14. The method of claim 1, wherein said first layer of dielectric material is comprised of a first layer of silicon dioxide ($SiO_2$) on said semiconductor substrate, a layer of low dielectric constant material on said first layer of silicon dioxide ($SiO_2$), and a second layer of silicon dioxide ($SiO_2$) on said layer of low dielectric constant material.

15. The method of claim 1, wherein said semiconductor substrate is comprised of silicon, and wherein said layer of amorphous semiconductor material is comprised of amorphous silicon, and wherein said amorphization dopant is comprised of one of germanium (Ge) or xenon (Xe), and wherein said back gate dopant is comprised of arsenic (As).

16. The method of claim 15, wherein a thickness of said layer of amorphous semiconductor material is in a range of from about 100 Å (angstroms) to about 500 Å (angstroms).

17. The method of claim 15, wherein a depth of said back gate region within said semiconductor substrate is from about 400 Å (angstroms) to about 600 Å (angstroms), and wherein a peak of a Gaussian dopant distribution profile of said implanted back gate dopant is at a middle of said depth of said back gate region.

18. A method for fabricating a MOSFET (metal oxide semiconductor field effect transistor) on a semiconductor substrate in SOI (semiconductor on insulator) technology, the method including the steps of:

A. forming a first layer of dielectric material on said semiconductor substrate, wherein said first layer of dielectric material is comprised of a first layer of silicon dioxide ($SiO_2$) on said semiconductor substrate, a layer of low dielectric constant material on said first layer of silicon dioxide ($SiO_2$), and a second layer of silicon dioxide ($SiO_2$) on said layer of low dielectric constant material;

B. etching a seeding window through said first layer of dielectric material to expose said semiconductor substrate through said seeding window;

C. depositing a layer of amorphous semiconductor material on said first layer of dielectric material, wherein said amorphous semiconductor material fills said seeding window to contact said semiconductor substrate through said seeding window, and wherein a thickness of said layer of amorphous semiconductor material is in a range of from about 100 Å (angstroms) to about 500 Å (angstroms);

D. depositing a second layer of dielectric material on said layer of amorphous semiconductor material, wherein said second layer of dielectric material is comprised of silicon dioxide ($SiO_2$) formed with a deposition temperature that is less than about 400° Celsius;

E. etching a front gate opening through said second layer of dielectric material to expose said layer of amorphous semiconductor material through said front gate opening, wherein said front gate opening is disposed substantially away from said seeding window such that said front gate opening does not overlap said seeding window;

F. forming spacers on sidewalls of said front gate opening to decrease a length of said front gate opening, wherein said spacers are comprised of silicon nitride ($Si_3N_4$), and wherein said length of said front gate opening before formation of said spacers is in a range of from about 250 nanometers to about 500 nanometers, and wherein said spacers decrease said length of said front gate opening by from about 30 nanometers to about 100 nanometers;

G. implanting an amorphization dopant into said semiconductor substrate through said front gate opening to form a back gate region of amorphous semiconductor material in said semiconductor substrate, wherein said back gate region is formed to be aligned with said front gate opening under said front gate opening, and wherein said amorphization dopant is comprised of one of germanium (Ge) or xenon (Xe), and wherein a depth of said back gate region within said semiconductor substrate is from about 400 Å (angstroms) to about 600 Å (angstroms);

H. implanting a back gate dopant into said back gate region of amorphous semiconductor material through said front gate opening, wherein said back gate dopant is comprised of arsenic (As), and wherein a peak of a Gaussian dopant distribution profile of said back gate dopant is at a middle of said depth of said back gate region;

I. forming a gate dielectric at a bottom of said front gate opening to contact said layer of amorphous semiconductor material;

J. filling a remaining portion of said front gate opening with a gate electrode material comprised of silicon germanium (SiGe);

K. etching said second layer of dielectric material and said spacers away from said layer of amorphous semiconductor material;

L. implanting a drain and source dopant into said gate electrode material and into exposed regions of said layer of amorphous semiconductor material to form a drain region and a source region that extend down within said layer of amorphous semiconductor material to contact said first layer of dielectric material;
wherein said drain and source dopant is an N-type dopant for fabrication of an NMOSFET (N-channel Metal Oxide Semiconductor Field Effect Transistor), and wherein said drain and source dopant is a P-type dopant for fabrication of an PMOSFET (P-channel Metal Oxide Semiconductor Field Effect Transistor); and M. performing a thermal anneal at a temperature less than about 650° Celsius to activate said back gate dopant within said back gate region and to activate said drain and source dopant within said drain region and said source region and within said gate electrode material;
wherein said layer of amorphous semiconductor material is recrystallized from said semiconductor substrate through said seeding window during said thermal anneal.

* * * * *